(12) United States Patent
Riva

(10) Patent No.: US 8,524,112 B2
(45) Date of Patent: Sep. 3, 2013

(54) PROCESS FOR THE PRODUCTION OF MICROELECTROMECHANICAL SYSTEMS

(75) Inventor: Marcello Riva, Hannover (DE)

(73) Assignee: Solvay Fluor GmbH, Hannover (DE)

( * ) Notice: Subject to any disclaimer, the term of this patent is extended or adjusted under 35 U.S.C. 154(b) by 363 days.

(21) Appl. No.: 12/808,718

(22) PCT Filed: Dec. 16, 2008

(86) PCT No.: PCT/EP2008/067623
§ 371 (c)(1),
(2), (4) Date: Jun. 17, 2010

(87) PCT Pub. No.: WO2009/080615
PCT Pub. Date: Jul. 2, 2009

(65) Prior Publication Data
US 2010/0267241 A1   Oct. 21, 2010

(30) Foreign Application Priority Data

Dec. 21, 2007   (EP) .................................... 07150296

(51) Int. Cl.
*C09K 13/00* (2006.01)
*C09K 13/04* (2006.01)
*C09K 13/08* (2006.01)
*C09K 13/06* (2006.01)

(52) U.S. Cl.
USPC .................. 252/79.1; 216/2; 216/58; 216/63; 216/67

(58) Field of Classification Search
None
See application file for complete search history.

(56) References Cited

U.S. PATENT DOCUMENTS

| 4,784,720 A | 11/1988 | Douglas |
| 4,805,456 A | 2/1989 | Howe et al. |
| 5,047,115 A | 9/1991 | Charlet et al. |
| 5,445,712 A | 8/1995 | Yanagida |
| 5,445,713 A | 8/1995 | Kunihisa et al. |
| 5,501,893 A | 3/1996 | Laermer et al. |
| 6,015,759 A * | 1/2000 | Khan et al. .................... 438/707 |
| 6,203,671 B1 * | 3/2001 | Demmin ................. 204/157.94 |
| 2001/0027702 A1 * | 10/2001 | Hobbs et al. .................... 75/585 |
| 2003/0189024 A1 | 10/2003 | Khan et al. |
| 2005/0029221 A1 | 2/2005 | Chang et al. |
| 2006/0108576 A1 | 5/2006 | Laermer et al. |
| 2007/0056926 A1 | 3/2007 | Ko |
| 2007/0187359 A1 | 8/2007 | Nakagawa et al. |
| 2007/0232048 A1 | 10/2007 | Miyata et al. |

FOREIGN PATENT DOCUMENTS

| EP | 0200951 A2 | 12/1986 |
| EP | 1498940 A2 | 1/2005 |
| EP | 1596419 A2 | 11/2005 |
| GB | 2290413 A | 12/1995 |
| JP | 10223614 A | 8/1998 |
| JP | 2003081919 A | 3/2003 |
| WO | WO 94/14187 A1 | 6/1994 |
| WO | WO 03/066515 A2 | 8/2003 |
| WO | WO 2007/116033 A1 | 10/2007 |
| WO | WO 2010/115734 A1 | 10/2010 |

OTHER PUBLICATIONS

Hibert, Cyrille—"State of the art DRIE processing", presentation at the Center of MicroNanoTechnology (CMI) annual review on May 18, 2004; accessed online on Feb. 28, 2012 at http://cmi.epfl.ch/etch/files/Talk_Cyrille_CMI2004.pdf ; 14 pgs.

Arana, Leonel, R., et al—"Isotropic etching of silicon in fluorine gas for MEMS micromachining", Journal of Micromechanics and Microengineering, 2007, vol. 17 (2) , pp. 384-392; 9 pgs.

Bargon, J., et al—"Oxygen Containing Fluorocarbons as Gaseous Etching Compounds for Reactive Ion Etching", 1978, IBM Technical Disclosure Bulletin, vol. 20 (8), p. 3295; 1 pg.

Vittorio, Salvatore A.—"MicroElectroMechanical Systems (MEMS)", Proquest, Released Oct. 2001; accessed online at http://www.csa.com/discoveryguides/mems/overview.php on Dec. 13, 2007 ; 7 pgs.

Peccoud, L., et al—"New trends and limits in plasma etching", 1987, Journal of Physics D: Applied Physics, vol. 20( 7) pp. 851-857; 7 pgs.

U.S. Appl. No. 12/296,139, filed Oct. 6, 2008, Anja Pischtiak, et al.

* cited by examiner

*Primary Examiner* — Duy Deo
(74) *Attorney, Agent, or Firm* — Beatrice C. Ortego

(57) ABSTRACT

Elemental fluorine and carbonyl fluoride are suitable etchants for producing microelectromechanical devices ("MEMS"). They are preferably applied as mixtures with nitrogen and argon. If applied in Bosch-type process, $C_4F_6$ is a highly suitable passivating gas.

18 Claims, No Drawings

PROCESS FOR THE PRODUCTION OF MICROELECTROMECHANICAL SYSTEMS

CROSS-REFERENCE TO RELATED APPLICATIONS

This application is a U.S. national stage application under 35 U.S.C. §371 of International Application No. PCT/EP2008/067623 file Dec. 16, 2008, which claims priority to European Patent Application No. 07150296.7 file Dec. 21, 2007, this whole content of this application being incorporated herein by reference for all purposes.

The present invention relates to the etching of circuit patterns on semiconductor wafer structures in the fabrication of integrated circuits, specifically it relates to the etching of deep trenches in structures in the fabrication of microelectromechanical systems ("MEMS").

MEMS concerns the technology of very small items, e.g. machines, generally ranging in the size from a micrometer to a millimeter. The potential of very small machines was appreciated long before the technology existed. Common applications include inkjet printers operating with piezoelectrics or thermal bubble ejection, accelerometers in cars, e.g. for airbag deployment in collisions, gyroscopes, silicon pressure sensors e.g. for monitoring car tires or blood pressure, optical switching technology or bio-MEMS applications in medical and health-related technologies. Microelectronic circuits process the information gathered by sensors from the environment through measuring mechanical, thermal, biological, chemical, optical or magnetic phenomena.

International patent application WO88/08930 (=U.S. Pat. No. 5,047,115) discloses a process for etching deep trenches into silicon using $SF_6$ or $NF_3$. The process is very suitable in the field of producing magnetic recording heads, a very important field of MEMS.

EP patent application EP-A-0 200 951 discloses a method for high-rate anisotropic etching of silicon by applying a mixture of $NF_3$ or $SF_6$, $N_2$, and a layer forming (passivating) gas such as $CHF_3$.

British patent GB 2 290 413 discloses a method for processing silicon structures by generating a trench in a first etching step using a gas which supplies fluorine, e.g. $SF_6$ or $NF_3$, and a passivating gas which forms Teflon®, e.g. $CHF_3$, $C_2F_6$, $C_2F_4$ or $C_4F_8$). Then, underetching is generated by a further isotropic plasma etching step. The structures produced may be used as acceleration sensors.

US patent application publication US 2003/0189024 discloses how to provide openings of variable shape by alternatively etching an opening in silicon and depositing a conformal (passivating) fluorocarbon polymer on the sidewalls. HBr and helium-oxygen and optionally $SF_6$ are mentioned as known isotropic etch.

US patent application publication US 2005/0029221 discloses a process for etching deep trenches in a two-step process. The first step includes etching a tapered trench with a tapered profile. $HBr/CF_4$ is used as preferred etchant in the first step. Then, trimming of the tapered trench by high-density plasma is performed in an isotropic etching step to provide a straight-profile deep trench by applying $SF_6/HBr/O_2$.

Object of the present invention is to provide an improved process for producing of microelectromechanical systems. Another object of the present invention is to provide novel etching gas mixtures suitable, i.a., for application in the process of the present invention. These and other objects of the present invention are achieved by the process and gas mixtures as outlined below.

According to a first aspect of the present invention, a method of producing a microelectromechanical system ("MEMS") from a structure is provided comprising a step wherein the structure is etched applying an etching gas comprising elemental fluorine or carbonyl fluoride ($COF_2$) or a mixture of both. Preferably, simultaneously in the etching step, or in an additional step after the etching, the structure is treated with a passivating gas. If etching and passivating are performed in separate steps, preferably a multitude of consecutive etching steps and passivating steps are performed. The passivating gas preferably is selected from compounds forming a fluorine-containing or fluoride-containing passivating layer. Preferably, the passivating agent is selected from organic compounds providing, in a plasma, a fluoropolymer; the passivating agent optionally is applied in the presence of hydrogen or a hydrogen-releasing gas.

Preferably, no hypofluorites, fluoroperoxides and/or fluorotrioxides are introduced into the reactor or intentionally formed therein. The gas mixtures are also free of compounds containing a CN bond and hydrogen. Preferably, the items to be etched do not contain WC (tungsten carbide) or its alloys.

Throughout the present invention, the term "comprising" includes the meaning of "consisting of".

The "structure" can be, for example, a silicon wafer in bulk micromachining, or an assembled item in surface micromachining.

While the process can be performed thermally, i.e. by performing it at high temperature, e.g. at a temperature equal to or higher than 200° C., and equal to or lower than 500° C., or according to the cryo process where super low temperatures are involved of up to −110° C., the process is best performed using the Bosch process which may be carried out in plasma etchers available from Alcatel, Advanced Materials, Plasma-Therm or Surface Technology Systems. The plasma conditions are induced by a magnetron or microwave irradiation. The invention will described further in view of the preferred embodiment of plasma etching.

Elemental fluorine and carbonyl fluoride can be applied as such, without diluent or additional compounds. It is preferred to apply them diluted by an inert gas, or in the presence of oxygen and/or in the presence of gases or vapors which have a passivating effect, or even diluted by oxygen and/or an inert gas and in the presence of a passivating gas. Preferred diluents are selected from the group consisting of nitrogen and noble gases. Further, additives like oxygen, hydrogen, or passivating gases can be added as is described later.

According to a first preferred embodiment of the present invention, mixtures of elemental fluorine with nitrogen, helium and/or argon are applied. The mixture can be formed in the reactor, or a mixture of elemental fluorine and the inert gas or gases is formed before introducing it into the reactor. If the gases are introduced in such a premixed form into the reactor, a homogenous or near-homogenous mixture can be provided throughout the reactor chamber. In general, the fluorine content of the mixture is preferably between 1 and 35% by volume. For example, a mixture of F2 and the inert gas can be supplied from pressurized bottles. In such pressurized bottles, a homogenous mixture forms.

Mixtures comprising elemental fluorine and nitrogen, mixtures comprising elemental fluorine and argon are preferably applied, and, especially preferably, mixtures comprising elemental fluorine, nitrogen and argon. If mixtures comprising only elemental fluorine and nitrogen are applied, the content of elemental fluorine preferably is equal to or greater than 1% by volume. The content of elemental fluorine is preferably equal to or lower than 25% by volume. The content of nitrogen is preferably equal to or lower than 99% by volume. Preferably, it is equal to or greater than 75% by volume. In an especially preferred embodiment, the content of elemental fluorine lies in the range of 18 to 22% by volume.

If mixtures comprising elemental fluorine and argon are applied, the content of argon preferably is equal to or greater than 50% by volume. Preferably, it is equal to or lower than 99% by volume. The content of elemental fluorine is preferably equal to or greater than 1% by volume. Preferably, it is equal to or lower than 50% by volume, especially equal to or lower than 25% by volume.

If mixtures comprising elemental fluorine, nitrogen and argon are applied, the content of elemental fluorine is preferably equal to or greater than 1% by volume. It is preferably equal to or lower than 25% by volume. The content of argon is preferably equal to or greater than 4% by volume. Preferably, the content of argon is equal to or lower than 25% by volume. The content of nitrogen is preferably equal to or greater than 4% by volume. It is preferably equal to or lower than 75% by volume.

The sum of elemental fluorine and argon preferably is equal to or lower than 50% by volume, especially preferably equal to or lower than 45% by volume. It is preferably equal to or higher than 25% by volume.

According to a second preferred embodiment, mixtures comprising carbonyl fluoride, but being free from elemental fluorine, are applied. This embodiment is preferred to the embodiments wherein gas mixtures are applied which contain elemental fluorine (see above) or fluorine and carbonyl fluoride (see below).

Carbonyl fluoride can be used very flexibly. Generally, it is applied together with other gases or vaporized liquids.

Carbonyl fluoride also can be used in anisotropic etching and isotropic etching.

If it is used in isotropic etching, it can be applied as such, but preferably, it is applied in admixture with other fluorinated organic gases or vapors, for example, saturated or unsaturated fluoroethers or fluorinated esters, for example, those described in JP 10-223614, but especially, it is applied together with nitrogen, oxygen and/or noble gases.

In general, the carbonyl fluoride content of the mixture is preferably equal to or greater than 1% by volume. In general, it is equal to or lower than 99% by volume. The mixture can be formed in the reactor, or, which is preferred, a mixture of carbonyl fluoride and the inert gas or gases is formed before introducing it into the reactor. If the gases are introduced in such a premixed form into the reactor, a homogenous mixture is provided throughout the reactor chamber.

Mixtures comprising carbonyl fluoride and nitrogen, mixtures comprising carbonyl fluoride and argon and mixtures comprising carbonyl fluoride, nitrogen and argon are advantageously applied. They can be applied together with hydrogen or a hydrogen releasing gas. Preferably, these mixtures also include oxygen.

If mixtures comprising only carbonyl fluoride and nitrogen are applied, the content of carbonyl fluoride preferably is equal to or greater than 1% by volume. The content of carbonyl fluoride is preferably equal to or lower than 75% by volume. The content of nitrogen is preferably equal to or greater than 25% by volume; preferably, it is equal to or less than 99% by volume. In one embodiment, the mixtures consist of carbonyl fluoride and nitrogen.

If mixtures comprising carbonyl fluoride and argon are applied, the content of argon preferably is equal to or greater than 10% by volume. Preferably, it is equal to or lower than 80% by volume. The content of carbonyl fluoride is preferably equal to or greater than 20% by volume; preferably, it is equal to or less than 90% by volume. In one embodiment, the mixtures consist of carbonyl fluoride and argon.

Mixtures comprising carbonyl fluoride, nitrogen and argon are very preferably applied. The content of carbonyl fluoride is preferably equal to or greater than 1% by volume. It is preferably equal to or lower than 50% by volume. The content of argon is preferably equal to or greater than 5% by volume. Preferably, the content of argon is equal to or lower than 50% by volume; especially, the content of argon is equal to or lower than 40% by volume. The content of nitrogen is preferably equal to or greater than 1% by volume; preferably, it is equal to or less than 80% by volume. In one embodiment, the mixtures consist of carbonyl fluoride, nitrogen and argon.

In a third preferred embodiment, elemental fluorine and carbonyl fluoride are applied together. The molar ratio of elemental fluorine to carbonyl fluoride lies preferably in the range of 1:99 to 99:1. Preferably, the mixture of elemental fluorine and carbonyl fluoride is diluted by oxygen and/or an inert gas, preferably nitrogen, or a noble gas. The mixtures preferably are constituted as described above in the first embodiment with the proviso that "mixture of elemental fluorine and carbonyl fluoride" has to be substituted for "elemental fluorine". It is preferred that the sum of the volumes of elemental fluorine and argon are equal to or less than 60% by volume. It has to be noted that, in the presence of a catalyst, $F_2$ and $COF_2$ may react with each other, especially to form fluorooxytrifluoromethane, a hypofluorite. In the process of the present invention, preferably such a reaction is not performed. Thus, no such catalyst is present in the reactor wherein etching is performed.

In one embodiment, the mixtures mentioned above of carbonyl fluoride, elemental fluorine or their mixtures, optionally including nitrogen and/or argon, may also comprise oxygen. Preferably, the content of oxygen is equal to or greater than 5% by volume. Very preferably, it is equal to or greater than 10% by volume. Preferably, the content of oxygen is equal to or less than 30% by volume. Very preferably, it is equal to or less than 25% by volume. The content of the other constituents is then diminished respectively. For example, if 10% by volume of the gas mixture is constituted by oxygen, then the content of the other constituents is reduced, for example, by 10% each.

If desired, elemental fluorine, carbonyl fluoride or the mixture of elemental fluorine and carbonyl fluoride, optionally also comprising nitrogen, noble gases and/or oxygen, can be applied together with etching gases known from the art. For example, they can be applied together with HBr, $SF_6$ or $NF_3$ as additional etching gas. In this case, the content of the additional gas is preferably less than 20% by weight of the gas mixture. In a preferred embodiment, elemental fluorine, carbonyl fluoride or their mixture are applied as the only etching gases, especially preferably together with argon, oxygen and/or nitrogen as described above. Here, argon, oxygen and/or nitrogen, respectively, are the balance to 100% by volume.

The mixtures described above can be applied in MEMS production in anisotropic and isotropic etching. In anisotropic etching, the etching gas forms a trench by etching the bottom of the trench without or nearly without affecting the side walls. Anisotropic etching can be induced by balancing physical etching (which essentially etches the bottom of the trench) and chemical etching (which etches bottom and side walls). If isotropic etching is desired, prevention of side wall etching is not necessary. In anisotropic etching, side wall etching is undesired. A preferred method of anisotropic etching is performed by either including a passivating gas into the etching gas which passivating gas protects the side walls, or by sequential etching with an etching gas and in a separate step, forming a passivating layer on the side walls using a passivating gas.

The passivating gas is applied to form a protective layer on the trench walls to prevent them to react with the etchant. The nature of the passivating gas depends on the kind of structure. For silicon as structure, bromine sources, for example elemental bromine or HBr can be applied as passivating gas. A layer of non-volatile $Si_xBr_y$-compounds form as protective layer. Other sources forming a protective layer with silicon are NO, $NO_2$, $CO_2$, CO, $N_2$, $O_2$, $CS_2$ or a combination of $SiCl_4$ and $N_2$. The passivating gas is preferably selected from cyclic, linear or branched saturated aliphatic compounds with 1 to 6 carbon atoms, substituted by at least one fluorine atom, or from cyclic, linear or branched unsaturated aliphatic compounds with 2 to 6 carbon atoms, substituted by at least one fluorine atom. These compounds consist of carbon and fluorine and optionally hydrogen. Preferably, at least 50% of the hydrogen atoms of the respective saturated or unsaturated compound are substituted by fluorine atoms. Saturated hydrofluorocarbons and saturated fluorocarbons with 1 to 6 carbon atoms and unsaturated hydrofluorocarbons and unsaturated fluorocarbons with 2 to 6 carbon atoms are preferred. Highly preferred compounds which are applicable as passivating gas are $c-C_4F_6$, $c-C_5F_8$, $CH_2F_2$, $CHF_3$, $CF_4$, $C_2F_6$, $C_3F_8$, $C_2F_4$, $C_4F_6$, and $C_4F_8$. The compounds $c-C_6F_6$ and $CF_3I$ are also suitable. $C_4F_6$ is especially preferred as passivating gas. The expert knows that some of the suitable compounds have a boiling point which is higher than 20° C. at normal pressure. He is aware that for these compounds, the term "gas" should be understood to mean "vapor". These compounds are suitable even if not gaseous at 20° C. because the process of the present invention is performed at a pressure low enough where these compounds are no longer liquid, but in the form of a vapor. He also is aware that these vapors function like gases.

Especially if only fluorocarbon compounds (consisting of carbon and fluorine) are applied as passivating gas, it can be preferred to include also a hydrogen-providing gas into the gas mixture. This may improve the anisotropic effect of the gas mixtures during etching. Without being bound by any theory, it is considered possible that hydrogen scavenges fluorine radicals, thus leaving fluorocarbon radicals in the reaction mixture. Fluorocarbon radicals are good etchants and still improve the anisotropic effect of the passivating gas; thus, hydrogen seems to make it possible to balance the ratio between fluorine radicals and fluorocarbon radicals. A higher share of fluorocarbon radicals compared to fluorine radicals is thought to reduce the reaction with the protective layer on the trench wall. Elemental hydrogen or hydrogen providing compounds, e.g. hydrogen-containing fluorocarbons, especially C1 or C2 hydrofluorocarbons, most preferably difluoromethane and trifluoromethane, are very suitable. The passivating gas can be present even in higher amounts. For example, the gas mixture may contain up to 45% by volume of the passivating compound. The content of one or all of the other constituents is then lower than given above.

Preferred gas mixtures for passivation only (with low or no anisotropic etching effect) in MEMS preparation include one or more of the above-mentioned aliphatic cyclic, linear or branched fluorocarbons or hydrofluorocarbons with 1 to 6 carbon atoms (saturated) or 2 to 6 carbon atoms (unsaturated). Optionally, a hydrogen or a hydrogen-releasing gas (a gas that releases hydrogen under thermal conditions, especially at temperatures at or higher than 200° C., or in a plasma), preferably difluoromethane or trifluoromethane, is also present, especially, if perfluorinated compounds are applied as passivating gas. If hydrogen or a hydrogen-releasing gas is present, it is preferably comprised in an amount of 1 to 5% by volume. Also, it is possible to include argon for improving the plasma.

The process for MEMS etching can principally be performed in two alternatives: the structure is treated with the etching gas and the passivating gas simultaneously, or treatment with the etching gas is performed in one step, and treatment with the passivating gas is performed in another step; the second alternative wherein etching and passivation are consecutively performed is called "Bosch" process. The "Bosch" type process is preferred. Of course, the treatment can be performed as a one-time treatment by extending the treatment time until the desired result, e.g. trench depth, is achieved. Especially if etching and passivation are performed separately, the steps of etching and passivation are repeated several times consecutively until the desired result is achieved. While it is technically advantageous to perform etching and passivation consecutively, it may be mandatory if etching gas and passivating gas are expected to react with one another in an undesired manner.

For example, if elemental fluorine is applied as etching gas and an unsaturated fluorocarbon or saturated or unsaturated hydrofluorocarbon is intended to be applied as passivating gas, it is very recommendable to perform etching and passivation in separate consecutive steps. Even if no side reaction is expected between elemental fluorine and the passivating gas, still the Bosch type process is advantageous compared to simultaneous etching and passivation because it is faster.

Carbonyl fluoride and $C_4F_6$ can be applied in separate steps or together in one simultaneous etching/passivating step, optionally in admixture with nitrogen or a noble gas, e.g. argon, or a hydrogen-releasing gas, because no undesired reaction will occur, elemental fluorine and a perfluorocarbon might also be applied simultaneously, because no adverse reaction is expected (nevertheless, consecutive application may be advantageous because of possible higher speed of reaction), while elemental fluorine and $C_4F_6$ should be applied in separate etching and passivating steps, because, even if diluted by nitrogen and/or a noble gas, an addition reaction may take place between elemental fluorine and $C_4F_6$.

If the etching and passivation are performed in separate steps, then etching can be performed with the etching mixtures describe above. Passivation can then be performed using the passivating gases mentioned above.

If desired, after forming the trench by etching and passivation, an additional step (or multitude of steps) can be performed to achieve underetching, as described in GB 2 290 413. In this step, it is preferred only to apply the etching gas.

The temperature of the structure during plasma treatment will generally be kept in a range of 20° C. to 100° C., but it may be higher. The pressure during the plasma treatment is preferably equal to $1.5 \cdot 10^{-2}$ mbar to 15 mbar. Preferably, the pressure is equal to or greater than $1 \cdot 10^{-1}$ mbar. It is preferably equal to or lower than 1.5 mbar.

While the structure may have variable forms, it is preferably in the shape of a wafer. Preferably, the structure is a silicon wafer.

The etching can be performed according to the bulk micromachining technology wherein the whole thickness of the item to be etched, e.g. a silicon wafer, is used to build the micromechanical structure. Alternatively, the etching can be performed according to the surface micromachining technology wherein layers are produced by applying coatings and selective etching of them. The etching process can generally be used in the deep reactive ion etching technology.

The process according to the present invention can be applied to produce semiconductors for microelectromechanical systems, for example, acceleration sensors, magnetic recording heads, ink jet printers, gyroscopes and other items as described above.

Certain gas mixtures useful in the process of the present invention are novel; they are also an aspect of the present invention and are claimed per se. In this aspect of the present invention, too, the term "comprising" includes the meaning of "consisting of". These gas mixtures contain no added hypofluorites, fluoroperoxides and/or fluorotrioxide, and preferably, the gas mixtures are essentially free of hypofluorites, fluoroperoxides and/or fluorotrioxide; the term "essentially" denotes a content of any of these compounds of less than 1% by volume, and preferably a content of 0% by volume. The gas mixtures are also free of compounds containing a CN bond and hydrogen.

The gas mixtures which are described in detail in the following paragraphs are, as mentioned above, claimed per se. They can be in the gaseous state, in the liquid state, in the solid state or even in the supercritical state. The gas mixtures claimed per se are preferably present in the liquid state. For example, they can be contained, in the liquid state, in pressurized containers, e.g. bottles. Of course, above the liquid, a certain amount of gaseous atmosphere exists, depending of the volume of the liquid and the container.

One embodiment of this aspect relates to mixtures comprising elemental fluorine and carbonyl fluoride. The mixtures according to the present invention preferably comprise elemental fluorine and carbonyl fluoride in a molar ratio of 1:99 to 99:1. The molecular ratio of elemental fluorine and carbonyl fluoride is preferably equal to or greater than 5:95. Preferably, it is equal to or lower than 95:5. Mixtures consisting of equimolar amounts of elemental fluorine and carbonyl fluoride are preferably excluded.

The mixture of elemental fluorine and carbonyl fluoride may further comprise oxygen, a noble gas, nitrogen. The noble gas preferably is selected from helium and argon, whereby argon is especially preferred. These mixtures are especially suitable for MEMS etching. Optionally, these mixtures may also comprise a passivating gas, preferably a passivating as described above. The passivating gas should not react with elemental fluorine; perfluoro compounds are very suitable.

The amounts of elemental fluorine, carbonyl fluoride, and optionally oxygen, argon, and/or nitrogen and, if comprised, a passivating gas, are given above.

The mixtures, claimed per se, of elemental fluorine and carbonyl fluoride can be in the gaseous state, in the liquid state, in the solid state or even in the supercritical state. The gas mixtures are preferably present in the liquid state. For example, they can be contained, in the liquid state, in pressurized bottles.

Another embodiment of this aspect of the present invention relates to mixtures comprising carbonyl fluoride, nitrogen and/or a noble gas, optionally a passivating gas and optionally hydrogen or a hydrogen-releasing gas. Preferably, the noble gas is elected from helium and argon, especially preferably it is argon.

According to one preferred embodiment, the mixtures consist of carbonyl fluoride and nitrogen, or they consist of carbonyl fluoride and argon, and, in both alternatives, optionally also contain oxygen. In mixtures comprising only carbonyl fluoride and nitrogen, the content of carbonyl fluoride preferably is equal to or greater than 1% by volume. The content of carbonyl fluoride is preferably equal to or lower than 75% by volume. The content of nitrogen is preferably equal to or greater than 25% by volume; preferably, it is equal to or less than 99% by volume. In one embodiment, the mixtures consist of carbonyl fluoride and nitrogen.

In mixtures comprising carbonyl fluoride and argon, the content of argon preferably is equal to or greater than 10% by volume. Preferably, it is equal to or lower than 80% by volume. The content of carbonyl fluoride is preferably equal to or greater than 20% by volume; preferably, it is equal to or less than 90% by volume. In one embodiment, the mixtures consist of carbonyl fluoride and argon.

Mixtures comprising carbonyl fluoride, nitrogen and argon are especially preferred. The content of carbonyl fluoride is preferably equal to or greater than 1% by volume. It is preferably equal to or lower than 50% by volume. The content of argon is preferably equal to or greater than 5% by volume. Preferably, the content of argon is equal to or lower than 50% by volume; especially, the content of argon is equal to or lower than 40% by volume. The content of nitrogen is preferably equal to or greater than 1% by volume; preferably, it is equal to or less than 80% by volume. In one embodiment, the mixtures consist of carbonyl fluoride, nitrogen and argon.

The mixtures may also comprise oxygen, hydrogen, a hydrogen releasing gas and/or a passivating gas. Details are explained above.

The mixtures, claimed per se, of carbonyl fluoride and nitrogen and/or a noble gas and optionally passivating gas or hydrogen can be in the gaseous state, in the liquid state, in the solid state or even in the supercritical state. The gas mixtures are preferably present in the liquid state. For example, they can be contained, in the liquid state, in pressurized bottles.

The inventive mixtures are suitable, for example, for performing the process according to the present invention, but also for other etching processes, for example, for producing semiconductors, for flat panel display production or for wafer cleaning.

Still another embodiment of this aspect of the present invention relates to mixtures comprising carbonyl fluoride and a passivating gas, and optionally also nitrogen, a noble gas and/or a hydrogen-releasing gas. These mixtures are suitable for simultaneous etching and passivating. The presence of argon is very preferred.

In mixtures comprising carbonyl fluoride, the passivating agent, argon and optionally nitrogen, hydrogen or a hydrogen-releasing gas, the content of carbonyl fluoride preferably is equal to or greater than 15% by volume, very preferably, equal to or greater than 20% by volume. Preferably, it is equal to or lower than 60% by volume. The content of the passivating agent is preferably equal to or greater than 10% by volume, very preferably, equal to or greater than 15% by volume. The content of the passivating gas is preferably equal to or lower than 50% by volume, very preferably, equal to or lower than 45% by volume. The content of argon preferably is equal to or greater than 20% by volume, very preferably, equal to or greater than 25% by volume. Preferably, the content of argon is equal to or lower than 50% by volume, very preferably, equal to or lower than 40% by volume. If nitrogen is comprised, its content is preferably in a range of 1 to 10% by volume. If hydrogen or a hydrogen-releasing gas is comprised, its content preferably is equal to or greater than 2% by volume. Preferably, it is equal to or lower than 15% by volume.

Preferably, the term "passivating gas" denotes inorganic or organic compounds other than $N_2$, $CO_2$, CO, $CHF_2Cl$, $O_2$ or CO; suitable passivating gas are compounds which react under thermal (200° C. and higher) or under plasma conditions with silicon to form silicon compounds with low volatility, or which form a passivating layer thus protecting the structure against etching. Especially preferably, the term "passivating gas" denotes one or more organic compounds selected from cyclic or linear or branched, saturated aliphatic compounds with 1 to 6 carbon atoms, substituted by at least one fluorine atom, or from cyclic or linear or branched, unsaturated aliphatic compounds with 2 to 6 carbon atoms, substituted by at least one fluorine atom. These compounds consist of carbon and fluorine and optionally hydrogen. Preferably, at least 50% of the hydrogen atoms of the respective saturated or unsaturated compound are substituted by fluorine atoms. Saturated hydrofluorocarbons and saturated fluorocarbons with 1 to 5 carbon atoms and unsaturated hydrofluorocarbons and fluorocarbons with 2 to 5 carbon atoms are preferred. Highly preferred compounds which are comprised as passivating gas are $c\text{-}C_4F_6$, $c\text{-}C_5F_8$, $CH_2F_2$, $CHF_3$, $CF_4$, $C_2F_6$, $C_3F_8$, $C_2F_4$, $C_4F_6$, and $C_4F_8$. $C_4F_6$ is especially preferred as passivating gas. The compounds $c\text{-}C_6F_6$ and $CF_3I$ are also suitable. The mixture of carbonyl fluoride and passivating gas may further include nitrogen, oxygen, and/or a noble gas. Even elemental fluorine can be comprised provided the passivating gas is a perfluorocarbon compound.

Still more preferably, the mixture comprises carbonyl fluoride, $C_4F_6$, and argon and optionally hydrogen or a hydrogen-releasing gas.

The mixtures, claimed per se, of carbonyl fluoride and passivating gas can be in the gaseous state, in the liquid state, in the solid state or even in the supercritical state. The gas mixtures are preferably present in the liquid state. For example, they can be contained, in the liquid state, in pressurized bottles.

These gas mixtures including a passivating gas are especially suitable for use in the etching step, the passivating step or the combined etching and passivating step, respectively.

Finally, an etching gas mixture consisting of elemental fluorine, nitrogen and argon and optionally oxygen is a further aspect of the present invention. This gas mixture contains equal to or more than 10% by volume of elemental fluorine. It contains equal to or less, preferably less, than 25% by volume of elemental fluorine. It contains equal to or more than 5% by volume of argon. It contains equal to or less than 15% by volume of argon. It contains equal to or more than 65% by volume of nitrogen. It contains equal to or less than 80% by volume of nitrogen. This mixture is very suitable for MEMS etching. If oxygen is contained, it is preferably present in a range between 2 and 15% by volume. The content of one or more of the other constituents (elemental fluorine, nitrogen, argon) may then be lower so that the constituents add up to 100% by volume.

The mixtures, claimed per se, of elemental fluorine, nitrogen and argon and optionally oxygen can be in the gaseous state, in the liquid state, in the solid state or even in the supercritical state. The gas mixtures are preferably present in the liquid state. For example, they can be contained, in the liquid state, in pressurized bottles.

It has been found that elemental fluorine is more effective than $SF_6$, and both elemental fluorine and carbonyl fluoride have a low GWP (greenhouse warming potential).

The invention will now be explained in further detail by the following examples.

EXAMPLES

Example 1

Mixtures Suitable for Etching Silicon in MEMS Production

General procedure: the different constituents are passed in gaseous form from respective storing bottles to a stainless steel container stored therein in gaseous form. By controlling the volume during storing the respective gases, gas mixtures comprising the appropriate amounts of gases given in table 1 are prepared.

TABLE 1

Etching gas mixtures (amounts given in % by volume)

| Example | $F_2$ | $COF_2$ | $N_2$ | Ar | $O_2$ |
|---|---|---|---|---|---|
| 1.1 | 20 | — | 70 | 10 | — |
| 1.2 | — | 70 | — | 20 | 10 |
| 1.3 | 5 | 65 | 20 | 10 | — |
| 1.4* | 5 | 55 | 20 | 10 | |

*Elemental fluorine and nitrogen are added as 1:4 v/v mixture.

TABLE 2

Passivating gas mixtures

| Example | $C_4F_6$ | Ar | $H_2$ | $CHF_3$ |
|---|---|---|---|---|
| 1.5 | 60 | 40 | — | — |
| 1.6 | 50 | 40 | — | 10 |
| 1.7 | 50 | 40 | 10 | — |
| 1.8 | 40 | 40 | 10 | 10 |

(amounts given in % by volume)

TABLE 3

Gas mixtures suitable for simultaneous etching and passivating

| Example | $COF_2$ | Passivating agent | Ar | Other |
|---|---|---|---|---|
| 2.1 | 35 | $C_4F_6$[1]: 35 | 30 | — |
| 2.2 | 40 | $C_4F_6$[1]: 20 | 30 | $CHF_3$: 10 |
| 2.3 | 40 | $C_4F_6$[1]: 20 | 30 | $H_2$: 10 |
| 2.4 | 25 | $C_3F_8$: 40 | 30 | $F_2$: 5 |

(amounts given in % by volume)
[1]Hexafluorobutadiene, available as Sifren ® from Solvay Fluor GmbH, Hannover, Germany

Example 3

Preparation of a MEMS Device by Consecutive Etching and Passivating (Bulk Micromachining)

A silicon wafer for a MEMS device is coated with a photo resist lacquer. After partial exposure of the photo resist lacquer with light according to the desired structure including desired trenches, non-exposed parts of the lacquer are removed. The silicon wafer is then put into a plasma chamber. An premixed etching mixture according to example 1.1 consisting of 20% by volume of elemental fluorine, 70% by volume of nitrogen and 10% by volume of argon is introduced into the chamber at a pressure of about 0.2 mbar, and the microwave radiation is started to initiate plasma conditions. Silicon in regions not covered by the photo resist is etched away isotropically whereby a trench forms in the silicon. After a trench with a width of about 20 μm is formed, the etching gas is removed from the reactor, and a passivation gas according to example 1.5 consisting of $C_4F_6$ (60% by volume) and argon 40% by volume) is introduced into the reactor, and the microwave radiation is started to initiate the plasma. The hexafluorobutadiene introduced into the reactor essentially forms a fluoropolymer coating on the walls of the trenches formed in the silicon, while the argon stabilizes the plasma. After a coating with desired thickness has formed on the walls, the passivating gas is removed, and fresh etching gas is reintroduced into the reactor. The silicon layer is then again isotropically etched, thereby deepening the trench formed in the first etching step. The passivating layer protects the wall of the trench. When the desired additional depth of the trench is achieved, etching is terminated and the etching gas is removed from the plasma reactor. Once again, passivating gas is introduced, and another passivating step is performed. Thereafter, the passivating gas is removed, and the anisotropic etching is continued. Etching and passivation are consecutively performed until a trench with desired depth has formed. The etched wafer can be removed from the chamber.

Example 4

Preparation of a MEMS Device Using Carbonyl Fluoride Etchant (Bulk Micromachining)

A wafer from monocrystalline silicon is coated with silicon dioxide and a photo resist lacquer. The wafer is then treated as described in example 3, but with an etchant mixture according to example 1.5.

Example 5

Preparation of a MEMS Device by Simultaneous Etching and Passivating (Bulk Micromachining)

A silicon wafer is coated with a dielectric layer of silicon dioxide which, in turn, is coated with a photo resist lacquer. After partial exposure of the photo resist lacquer with light according to the desired structure including desired trenches, non-exposed parts of the lacquer are removed. The silicon wafer is then put into a plasma chamber. An gas mixture according to example 2.1 consisting of 35% by volume of elemental carbonyl fluoride, 30% by volume of argon and 35% by volume of $C_4F_6$ is introduced into the chamber at a pressure of about 0.2 mbar, and the microwave radiation is started to initiate plasma conditions. Silicon dioxide in regions not covered by the photo resist is etched away. During etching, a trench forms. Simultaneously, a fluoropolymer passivation layer is formed on the walls of the trench. The treatment is continued until the trench has the desired depth. The etching/passivating gas is removed from the reactor, and the etched silicon wafer can be removed from the chamber.

Example 6

Preparation of a MEMS Device by Simultaneous Etching and Passivating with a Gas Mixture Comprising a Hydrogen-Releasing Gas (Bulk Micromachining)

Example 5 is repeated with the gas mixture of example 2.2 consisting of 40% by volume of carbonyl fluoride, 20% by volume of $C_4F_6$, 30% by volume of argon and 10% by volume of $CHF_3$.

Example 7

Preparation of a MEMS Device (Surface Micromachining)

A round silicon wafer disk forms the basis of the MEMS to be produced. First, a silicon nitride layer is formed on the wafer by means of a low-pressure CVD (Chemical Vapor Deposition) process. Then, a sacrificial layer of silicon dioxide is deposited, again by means of LPCVD. The sacrificial layer allows a beam to be freely moving on the MEMS device. By applying lithographic techniques, the sacrificial layer is opened, e.g. by wet etching with $HF/NH_4F$, to allow anchoring of the planned beam. Then, a polysilicon layer is deposited by means of LPCVD. To remove those parts of the layer which are not part of the defined structure of the polysilicon layer, a lithographical mask is applied, and then, an etching gas of table 1, e.g. the gas mixture of example 1.1, is applied in a plasma chamber to remove the undesired parts of the polysilicon layer on the wafer. Then, another layer is applied, e.g. photoresist SU8, an epoxy-based resin used as structural material. Details about SU8 and how to apply it can be found in http://www.geocities.com/guerinlj/?200720.

Gold as means for heating the MEMS is applied in a lift-off process and is deposited by electronic-beam evaporation using lithography to remove undesired parts of the SU8 layer together with deposited gold thereon, so that only the desired gold structure remains. The sacrificial layer is now removed, e.g. with the wet etching mixture mentioned above. Now, the beam is released, and the structure is finished.

The invention claimed is:

1. A method of producing a microelectromechanical system ("MEMS") from a structure comprising a step wherein the structure is etched applying an etching gas,
wherein said etching gas is a mixture consisting of elemental fluorine, nitrogen, argon, and optionally oxygen, said mixture containing equal to or more than 10% by volume of elemental fluorine, equal to or less than 25% by volume of elemental fluorine, equal to or more than 5% by volume of argon, equal to or less than 15% by volume of argon, equal to or more than 65% by volume of nitrogen, equal to or less than 80% by volume of nitrogen, and optionally between 2 and 15% by volume of oxygen, the contents adding up to 100% by volume.

2. The method according to claim 1, wherein consecutively to etching, passivation of at least a part of an etched surface of the structure is provided.

3. The method according to claim 2, wherein said passivation is carried out with a passivating agent selected from organic compounds providing, in a plasma, a fluoropolymer.

4. The method according to claim 3, wherein the passivating agent is a passivating gas selected from the group consisting of c-$C_4F_6$, c-$C_5F_8$, $CH_2F_2$, $CHF_3$, $CF_4$, $C_2F_6$, $C_3F_8$, $C_2F_4$, $C_4F_6$, c-$C_6F_6$, $CF_3I$, and $C_4F_8$.

5. The method according to claim 1, wherein said structure is a silicon wafer.

6. The method according to claim 1, wherein a passivating gas comprising $C_4F_6$ is applied for providing passivation in a passivating step, and wherein the etching step and passivating step are performed consecutively after each other.

7. A mixture, comprising carbonyl fluoride, a passivating gas, and argon, and optionally further comprising a compound selected from the group consisting of nitrogen, hydrogen, and a hydrogen-releasing gas,
wherein the content of carbonyl fluoride is equal to or greater than 15% by volume and equal to or lower than 60% by volume; wherein the content of the passivating agent is equal to or greater than 10% by volume and equal to or lower than 50% by volume; wherein the content of argon is equal to or greater than 20% by volume and equal to or lower than 50% by volume; wherein, when nitrogen is comprised in the mixture, its content is in a range of from 1 to 10% by volume; and wherein, when hydrogen or the hydrogen-releasing gas is comprised in the mixture, its content is equal to or greater than 2% by volume and equal to or lower than 15% by volume.

8. The mixture according to claim 7, further comprising nitrogen.

9. The mixture according to claim 7, wherein the passivating gas is selected from the group consisting of c-$C_4F_6$, c-$C_5F_8$, $CH_2F_2$, $CHF_3$, $CF_4$, $C_2F_6$, $C_3F_8$, $C_2F_4$, $C_4F_6$, c-$C_6F_6$, $CF_3I$, and $C_4F_8$.

10. A mixture consisting of elemental fluorine, nitrogen, argon, and optionally oxygen, said mixture containing equal to or more than 10% by volume of elemental fluorine, equal to or less than 25% by volume of elemental fluorine, equal to or more than 5% by volume of argon, equal to or less than 15% by volume of argon, equal to or more than 65% by volume of nitrogen, equal to or less than 80% by volume of nitrogen, and optionally between 2 and 15% by volume of oxygen, the contents adding up to 100% by volume.

11. The mixture according to claim 10, being in liquid state.

12. The mixture according to claim 11, being compressed in a container.

13. The mixture according to claim 10, wherein the sum of elemental fluorine and argon is equal to or lower than 45% by volume and equal to or higher than 25% by volume.

14. The mixture according to claim 10, wherein the content of elemental fluorine is in the range of from 18 to 22% by volume.

15. The mixture according to claim 7, being in liquid state.

16. The mixture according to claim 11, wherein the passivating gas is $C_4F_6$.

17. A method for producing a microelectromechanical system ("MEMS") from a structure, said method comprising simultaneously etching and passivating the structure while applying the mixture according to claim 7.

18. The mixture according to claim 7, further comprising hydrogen or a hydrogen-releasing gas.

\* \* \* \* \*